US012736562B2

(12) United States Patent
Márton

(10) Patent No.: US 12,736,562 B2
(45) Date of Patent: Sep. 15, 2026

(54) MERCURY PROBE APPARATUS WITH IMPROVED SAFETY

(71) Applicant: SEMILAB Semiconductor Physics Laboratory Co., Ltd., Budapest (HU)

(72) Inventor: Attila Márton, Budapest (HU)

(73) Assignee: SEMILAB SEMICONDUCTOR PHYSICS LABORATORY CO., LTD., Budapest (HU)

( * ) Notice: Subject to any disclaimer, the term of this patent is extended or adjusted under 35 U.S.C. 154(b) by 150 days.

(21) Appl. No.: 18/939,399

(22) Filed: Nov. 6, 2024

(65) Prior Publication Data

US 2025/0147070 A1 May 8, 2025

(30) Foreign Application Priority Data

Nov. 7, 2023 (HU) .................................. P2300380

(51) Int. Cl.
*G01R 1/06* (2006.01)
*G01R 1/067* (2006.01)

(52) U.S. Cl.
CPC ................................ *G01R 1/06783* (2013.01)

(58) Field of Classification Search
CPC ...... G01R 1/06783; G01R 3/00; G01R 1/067; G01R 1/06794; G01R 27/08; G01R 27/2605; H10P 74/207
See application file for complete search history.

(56) References Cited

U.S. PATENT DOCUMENTS

| | | | | |
|---|---|---|---|---|
| 4,587,484 | A | 5/1986 | Shulman | |
| 7,253,649 | B1 | 8/2007 | Chen | |
| 2013/0113511 | A1* | 5/2013 | Goeke | G01R 1/18 324/755.01 |
| 2021/0239734 | A1* | 8/2021 | Walczyk | B81B 7/02 |
| 2021/0364551 | A1* | 11/2021 | Ji | G01R 31/2889 |

FOREIGN PATENT DOCUMENTS

| | | |
|---|---|---|
| JP | 6044521 B2 | 12/2016 |

* cited by examiner

*Primary Examiner* — Giovanni Astacio-Oquendo
(74) *Attorney, Agent, or Firm* — Olson & Cepuritis, Ltd.

(57) ABSTRACT

An semiconductor wafer measurement apparatus includes a holder; a probe with a capillary tube containing a mercury column for contacting a wafer with the column; a pneumatic control means applying a partial vacuum or pressure above the column; a probe arm affixed to the probe; a positioning means controlling the position of the tube relative to the wafer; a measurement means causing a current through the wafer and for measuring electrical properties of the wafer; a first electrical contact connected to the column; a second electrical contact connected to the holder; a mercury container; and a control unit in communication with the pneumatic control means, the positioning means and the measurement means. The probe has a measurement position and a mercury change position. The tube is separated from the mercury container in the measurement position, and the tube is in fluid communication with the mercury container in the change position.

15 Claims, 7 Drawing Sheets

MERCURY PROBE APPARATUS WITH IMPROVED SAFETY

CROSS-REFERENCE TO RELATED APPLICATIONS

This application claims priority to Hungarian Application Serial No. P2300380, filed on Nov. 7, 2023, the entire contents of which is incorporated herein by reference.

FIELD OF THE INVENTION

This invention relates to a method and apparatus for measuring the electrical properties of a semiconductor wafer using a mercury column as one of the contacts, wherein said method and apparatus improves safety and reduces maintenance needs.

BACKGROUND

Mercury columns are used as a non-invasive contact for measuring of the electrical properties of a semiconductor wafers. However, mercury is highly toxic, and presents both health risks and environmental pollution risks, therefore its handling is dangerous and requires specially trained personnel.

U.S. Pat. No. 4,587,484 describes an apparatus for measuring the electrical properties of a semiconductor wafer through a mercury column. The wafer is contacted by a capillary from the top and mercury is sucked from a reservoir into the capillary by vacuum. Imperfection of the sealing between the wafer and the capillary may lead to spilling a significant amount of mercury.

U.S. Pat. No. 7,253,649 describes a similar arrangement for measuring the electrical properties of a wafer, with the wafer being contacted from below by the mercury column. This arrangement reduces the amount of mercury that is spilled upon sealing failure, but the large amount of mercury to be held in the reservoir that is necessary for reaching the sample through relatively long tubes still possess significant danger in the event of failure of the pneumatic system.

Japan publication pamphlet no. JP6044521 describes a device for measuring electric characteristics of a semiconductor wafer via a mercury probe, wherein the mercury is bubbled and cleaned within the reservoir between measurements. Due to the periodic cleaning, the mercury cartridge needs replacement less often, but requires periodic replacement nonetheless, because some contaminating materials cannot be perfectly removed from the mercury.

SUMMARY

All of the aforementioned devices typically have a relatively large mercury reservoir, typically of a volume of 1-2 $cm^3$, that is in fluid communication with the capillary tube and thus present the danger of spilling a large amount of mercury in case of a seal failure or a fault of the pneumatic system.

During measurements, the mercury becomes contaminated via oxidation of the mercury, and by small particles and other contaminants collected from the surface of the wafer. This results in the need of periodic replacement of the mercury content of the device, which is performed by manually replacing the whole unit including the mercury reservoir.

While the danger of spilling a large amount of mercury could be reduced in the aforementioned systems by reducing the amount of mercury held in the reservoir, this would come at the cost of reducing the time between necessary replacements of the mercury containing unit, because the same amount of contamination introduced into a smaller amount of mercury would result in reduced measurement accuracy sooner. Depending on the cleanliness of the surroundings of the apparatus and on the amount of measurements carried out, replacement of the mercury in devices having a supply of 1-2 $cm^3$ may be necessary as often as a couple of weeks.

In light of the foregoing, this specification describes techniques to eliminate or at least ameliorate the drawbacks of the prior art solutions. More specifically, the specification describes a mercury probe apparatus for measuring the electrical properties of a semiconductor wafer with improved safety, wherein the danger of mercury spill is reduced without increasing the frequency of maintenance. Among other advantages, the described measurement apparatus can provide improved safety, wherein the apparatus is able to use fresh mercury for measurements without manual servicing. In some examples, the evaporation of mercury and the emission of mercury vapor is practically eliminated.

In general, in a first aspect, the invention features an apparatus for measuring electrical properties of a semiconductor wafer, said apparatus including: a wafer holder; a mercury probe for contacting the top surface of said wafer with a mercury column, said mercury probe including a capillary tube for containing said mercury column; a pneumatic control means for applying a partial vacuum or pressure above said mercury column within said capillary tube; a probe arm having said mercury probe affixed thereto; a positioning means for controlling the position of said capillary tube relative to the upper surface of said wafer; a measurement means for causing an electrical current to flow through said wafer and for measuring electrical properties of said wafer; a first electrical contact electrically connected to said mercury column and to said measurement means; a second electrical contact electrically connected to said wafer holder and said measurement means; a clean mercury container; and a control unit in operating connection with the pneumatic control means, the positioning means and the measurement means, wherein said mercury probe has at least one measurement position and a first mercury change position, the capillary tube is separated from the clean mercury container in said at least one measurement position, and the capillary tube is in fluid communication with the clean mercury container in said first mercury change position.

In general, in a second aspect, the invention features a method for measurement of electrical properties of a semiconductor wafer that is arranged on a wafer holder, said method including: bringing a capillary tube that contains a mercury column into contact with a top surface of the wafer; lowering the mercury column so as to form an electric contact between the mercury column and the top surface of the wafer; applying a voltage between the mercury column and the wafer holder that is in electrical connection with said wafer; performing electrical measurement to determine at least one electric parameter of said wafer; checking whether a trigger condition is fulfilled, and if the trigger condition is fulfilled, the mercury column is replaced from a clean mercury container.

BRIEF DESCRIPTION OF THE DRAWINGS

In what follows, examples of the apparatus and the operation thereof are described in detail with reference to the attached drawing, where.

The same reference numbers on different Figures indicate the same parts.

DETAILED DESCRIPTION

Figure 1:
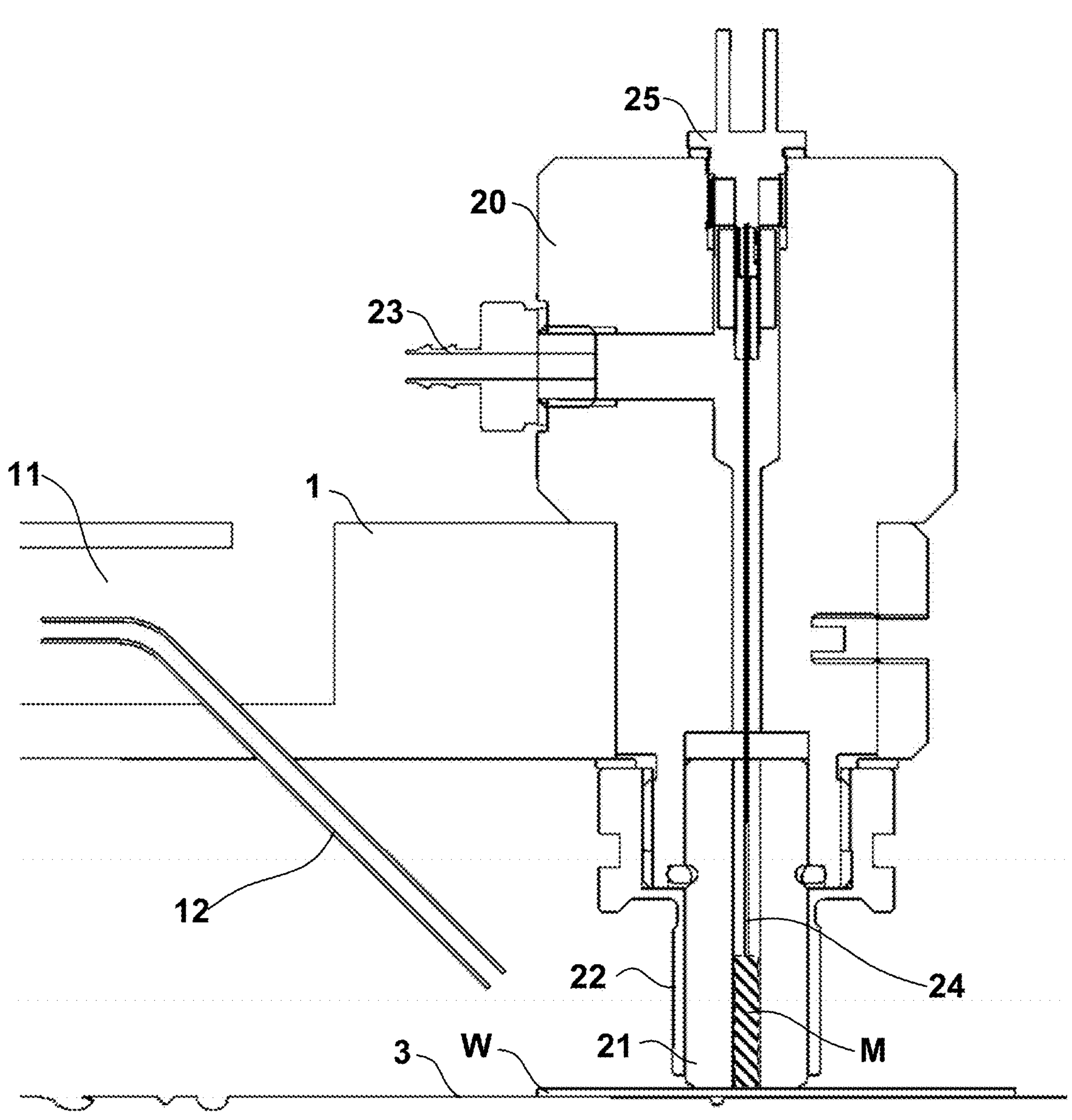
FIG. 1 is a sectional side view of the probe arm with the probe head in the measurement position, during measurement.

FIG. 1 is a sectional side view of a probe arm 1 of the apparatus, with a probe head arranged in a measurement position. The probe head includes a base 20 fixed to the probe arm 1, a capillary tube 21 that is made of, e.g., a dielectric material, such as a glass, a first electric contact 24 arranged at least partially within the capillary tube 21 and by, e.g., a metallic wire, pneumatic control means 23, e.g. a fluid connection for selectively producing partial vacuum or ambient pressure within the capillary tube 21 for drawing up a mercury into the capillary tube 21, holding it, and releasing it. During measurement—as shown in FIG. 1—a mercury column M is arranged within the capillary tube 21 so that the bottom surface of the mercury column M is in contact with the top surface of a sample, i.e., a wafer W. The first electric contact 24 is in contact with the mercury column M, e.g., by penetrating into it. For the correct operation of the equipment a sufficiently high mercury column M has to be drawn up the capillary for providing electric contact between the first electrical contact 24 and the mercury column M. As shown in the Figure, during measurement, only the mercury that is present in the capillary tube 21 is moved by the fluid pressure supplied through the fluid connection 23, and accordingly, only this very small amount of mercury could be potentially spilled if the contact between the capillary tube 21 and the wafer W is not sealing well enough. In some examples, the inner diameter of the capillary tube 21 is 1.7 mm, the height for the mercury column is about 10-15 mm and thus the mass of the mercury within the probe head is less than 0.5 gram.

The wafer W is arranged on a wafer holder 3, e.g., that is formed by a chuck. The wafer holder 3 may have vacuum grooves for holding a bowed wafer flat against the surface of the wafer holder 3. The wafer holder 3 or at least a part or the whole of its top surface can be made of an electrically conducting material and thus when a wafer W is arranged on the wafer holder 3, an electrical connection is established between a bottom surface of the wafer W and the top surface of the wafer holder 3.

In the exemplary embodiment shown in FIG. 1, the capillary tube 21 is fixed to the probe head 2 by metallic sleeve 22 that also provides electric shielding against electric noise from outside.

The apparatus includes positioning means for changing the relative position of the probe head 2 and the wafer holder 3. The positioning means (not shown in the Figures) must have three degrees of freedom regarding the relative movement of the probe head relative to the wafer holder 3. Accordingly, the positioning means may include at least one vertical positioning means and at least two of one or two horizontal positioning means and one or two rotational positioning means with vertical axes. This way the vertical distance between the probe head 2 and the wafer holder 3 may be changed and that the probe head may be positioned above any portion of the surface of the wafer holder 3 and at least one position that is not above the wafer holder 3. This may be achieved in any manner known to a person skilled in the art, e.g. using an XYZ stage for linear movement of the wafer holder or the probe head or using two separate XYZ positioning means for moving each. Alternatively or additionally to the horizontal translation movement(s), the wafer holder 3 and/or the probe arm 1 may be rotated around two different vertical axes.

According to the exemplary embodiment shown in FIG. 1, the probe arm 1 includes a gas flow channel 11 and a gas pipe 12 for blowing an inert gas to a measurement site for removing particles from the surface of the wafer W in order to reduce contamination of the mercury and thus prolong the lifetime of each load of mercury.

Measurement is carried out in the position of the probe head shown in FIG. 1, i.e. when the capillary tube 21 and the mercury column M contacts the surface of the wafer W. The apparatus further includes an electrical measurement means (not shown in the Figures), having two terminals. Said electrical measurement means is suitable for providing an electrical voltage or electrical current between its terminals. A first terminal of the electrical measurement means is connected to an electrical terminal 25 of the probe head. Said electrical terminal 25 is electrically connected to the first electrical contact means 24, which is electrically connected to the mercury column M, which contacts the top surface of the wafer W. A second terminal of the electrical measurement means is electrically connected to the wafer holder 3 and through the wafer holder 3 to a bottom surface of said wafer W. By producing one of a DC voltage and a DC current between its terminals, and measuring the other one of the DC voltage and the DC current, the electrical measurement means can measure the current-voltage characteristic, i.e. resistance, of the wafer or by producing one of an AC voltage and an AC current between its terminals, and measuring the other one of the AC voltage and the AC current, the measurement means can measure the capacitance-voltage characteristic of the wafer W.

After finishing a measurement, a partial vacuum of at least about 5-15 Hgmm below the ambient pressure is created via the fluid connection 23 so as to raise the mercury column M from the surface of the wafer W. There is a very slight misalignment between the bottom surface of the capillary tube 21 and the top surface of the wafer W, which provides a gap that is large enough to allow air to enter to and escape from the space below the mercury column M, but small enough to prevent mercury from escaping when it is not held by pressure difference between the space above it and the surroundings.

The apparatus further includes a control unit (not shown), that is in operating connection with the pneumatic control means 23, the positioning means and the measurement means, especially to control the partial vacuum provided by the pneumatic control means, to control the position of the mercury probe via the positioning means and to control the voltage supplied by the measurement means. In some examples, the control unit is suitable to receive and process measurement results of the measurement means and to control the operation of at least the pneumatic control means on the basis of said measurement results, especially during a mercury change operation.

Figure 2:
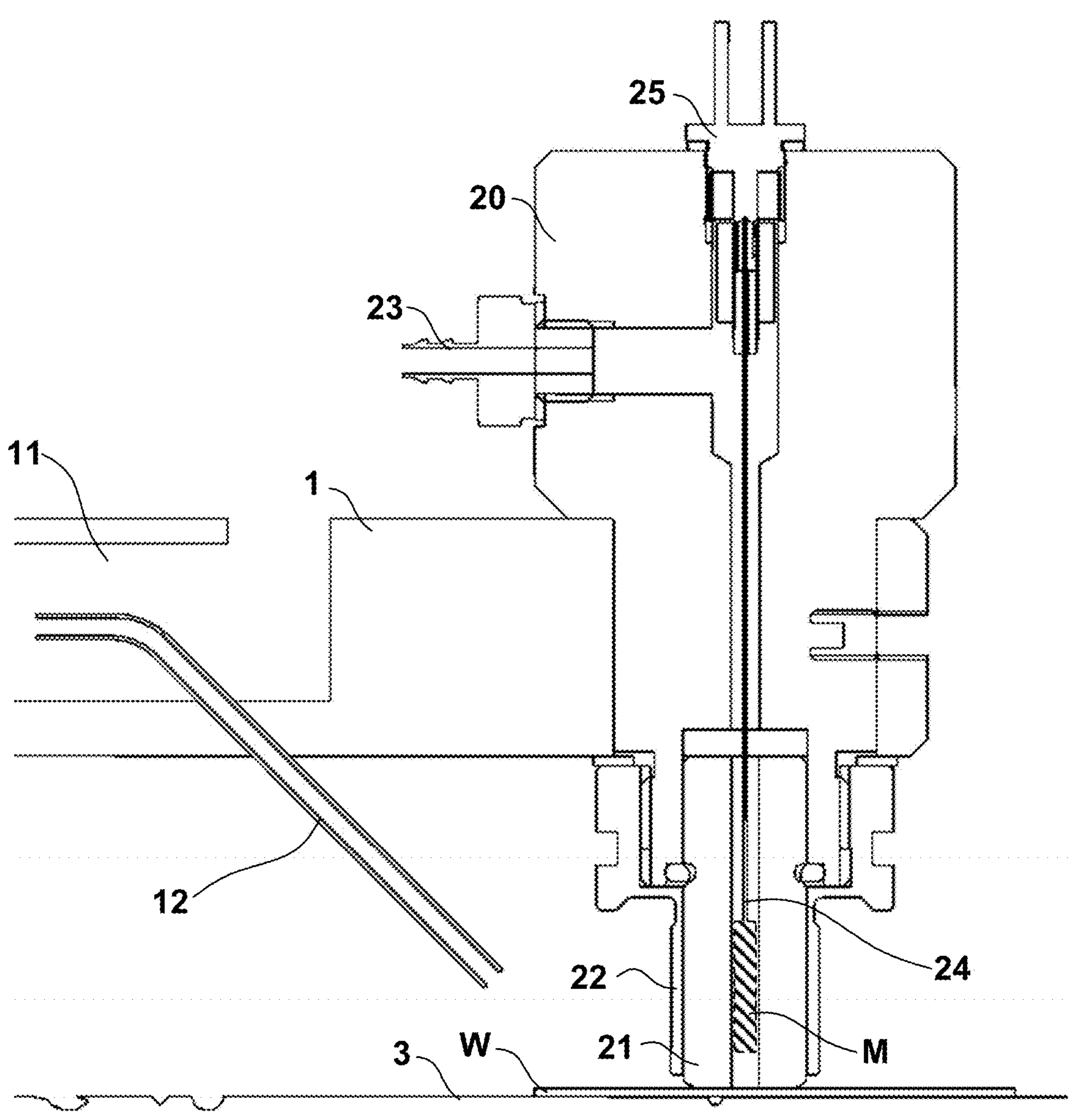
FIG. 2 is a sectional side view of the probe arm with the probe head in the measurement position, before and after measurement.

FIG. 2 shows the probe arm 1 and the probe head of the apparatus in a stage preceding and following the measurement, when the mercury column M is held by partial vacuum from above. The probe head with the probe arm 1 may be raised (or the wafer lowered) and then relative horizontal and/or rotational movement of the probe head and the wafer may be effected by the positioning means so as to select a different measurement site. On the new measurement site, the probe head is lowered onto the surface of the wafer W so that the capillary tube 21 contacts the top surface of the wafer W, the partial vacuum holding the mercury is released and the space above the mercury column M is pressurised and thus the mercury column M is lowered so as to contact the top surface of the wafer W.

Figure 3:
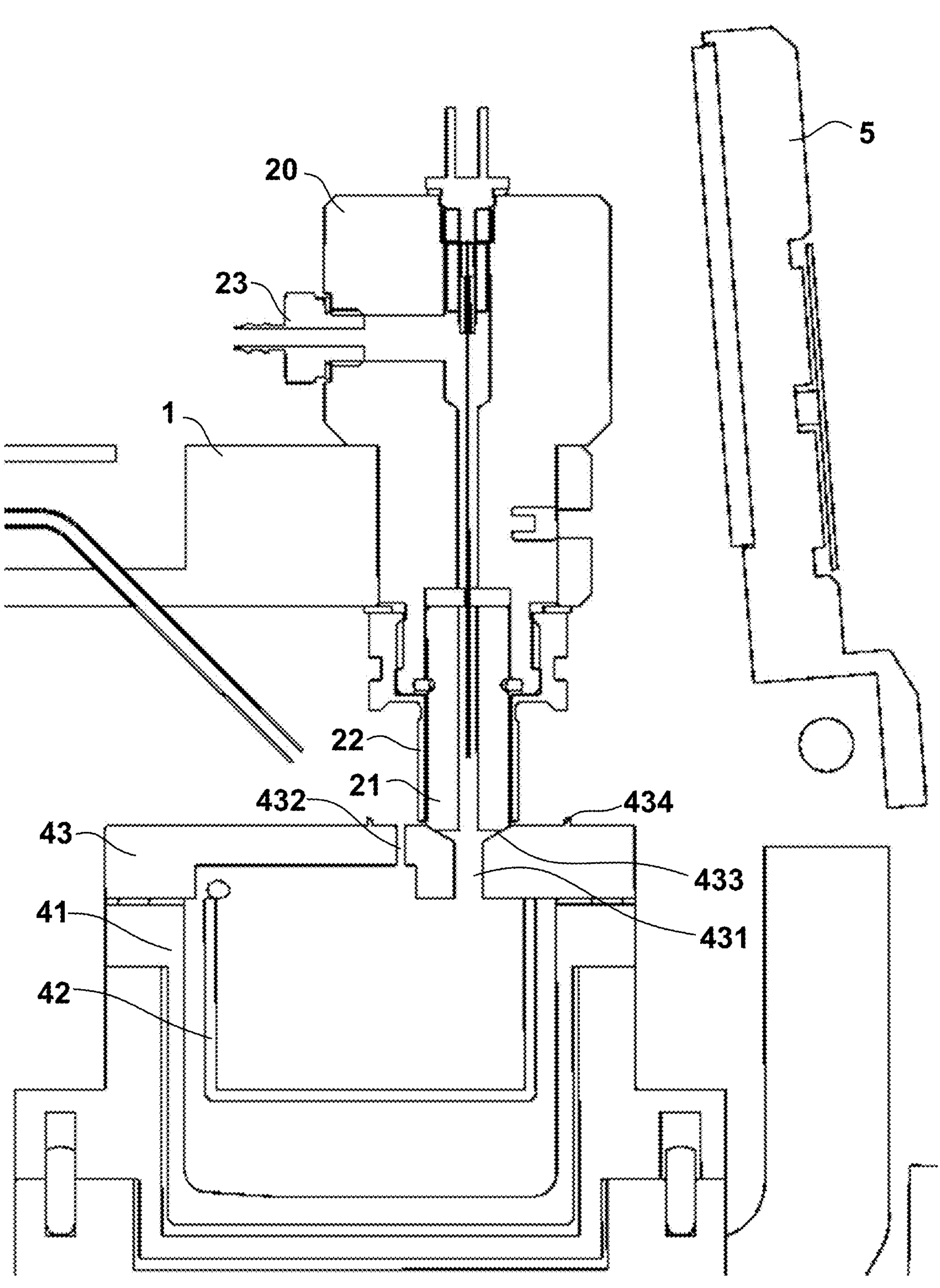
FIG. 3 is a sectional side view of the probe arm with the probe head in a first mercury change position.

FIG. 3 illustrates the apparatus during a mercury change operation. Upon the fulfilment of a trigger condition, the apparatus performs a mercury change operation, i.e. it refreshes the mercury held in the capillary tube. This is performed by releasing the partial vacuum holding the mercury column M and letting the mercury fall into a container, and then drawing up a new column of mercury. The release of the used mercury and drawing up of a new column may be performed by using the same container to the same effect as the prior art solutions, resulting the mere dilution of the contamination. However, in the example shown in FIG. 3, two different containers are provided: a clean mercury container 41 for storing clean mercury and a contaminated mercury container 42 for storing used mercury. FIG. 3 shows the first stage of mercury change operation, i.e. when the used mercury (not shown) is released into the contaminated mercury container 42. The contaminated mercury container 42 can be arranged within the clean mercury container 41 so that the bottom of the contaminated mercury container 42 rests on the surface of the clean mercury thus ensuring that the hydrostatic pressure on the bottom of the clean mercury container 41 stays the same after any number of mercury change operations thus facilitating drawing up of a new mercury column of the same volume each time.

The clean mercury container 41 and the contaminated mercury container 42 are covered by a cover plate 43 that can be secured onto the clean mercury container 41 to limit the escape of mercury vapor during a mercury change operation. A lid 5 is arranged at a top portion of the cover plate 43. Said lid is open during a mercury change operation, and otherwise the lid 5 is closed above cover plate 43 to completely prevent escape of mercury vapor. The lid 5 can be biased toward its closed position so that it stays closed without deliberate operation for opening it. The clean mercury container 41, the contaminated mercury container 42, the cover plate 43 and the lid 5 together form a mercury containment unit that safely stores the mercury and provides the possibility for the apparatus to replace the mercury content used for measurements at any arbitrary time for a completely clean mercury load. The cover plate 43 includes first through-hole, i.e. a dumping hole 431 above the contaminated mercury container 42 to allow dropping the used mercury from the capillary tube 21 directly into the contaminated mercury container 42.

In some examples, said first stage of mercury change operation is performed by bringing the capillary tube into contact with the cover plate 43 so that the hole of the capillary tube is situated above the through-hole 431 of the cover plate 43. According to a further preferred embodiment, the cover plate 43 has a funnel shaped indentation 433 around the top side of the dumping hole 431 that facilitates safe dumping of used mercury by providing a slanted surface that guides any mercury droplets (possibly created by the splashing down of the dumped mercury) into the contaminated mercury container 42.

The cover plate 43 can further include a first pressure relief hole 432 separate from the dumping hole 431 and preferably smaller than the dumping hole 431 to allow some air to escape the contaminated mercury container 42 when used mercury is dumped into it, but to also restrict flow of gases between the inside and outside of the mercury containment unit to limit the escape of mercury vapor. The pressure relief hole 432 facilitates the dumping, as the downward movement of the mercury from the capillary tube 21 would cause a pressure increase in the contaminated mercury container 42, which in turn would slow down the movement of mercury or could even prevent some of the mercury from exiting the capillary tube 21.

The cover plate optionally further includes a first rim 434 projecting upward from a top surface of the cover plate 43 and surrounding top ends of both the dumping hole 431 and of the first pressure relief hole 432 to prevent any mercury droplets that escaped from rolling away on the surface of the cover plate 43.

Figure 4:
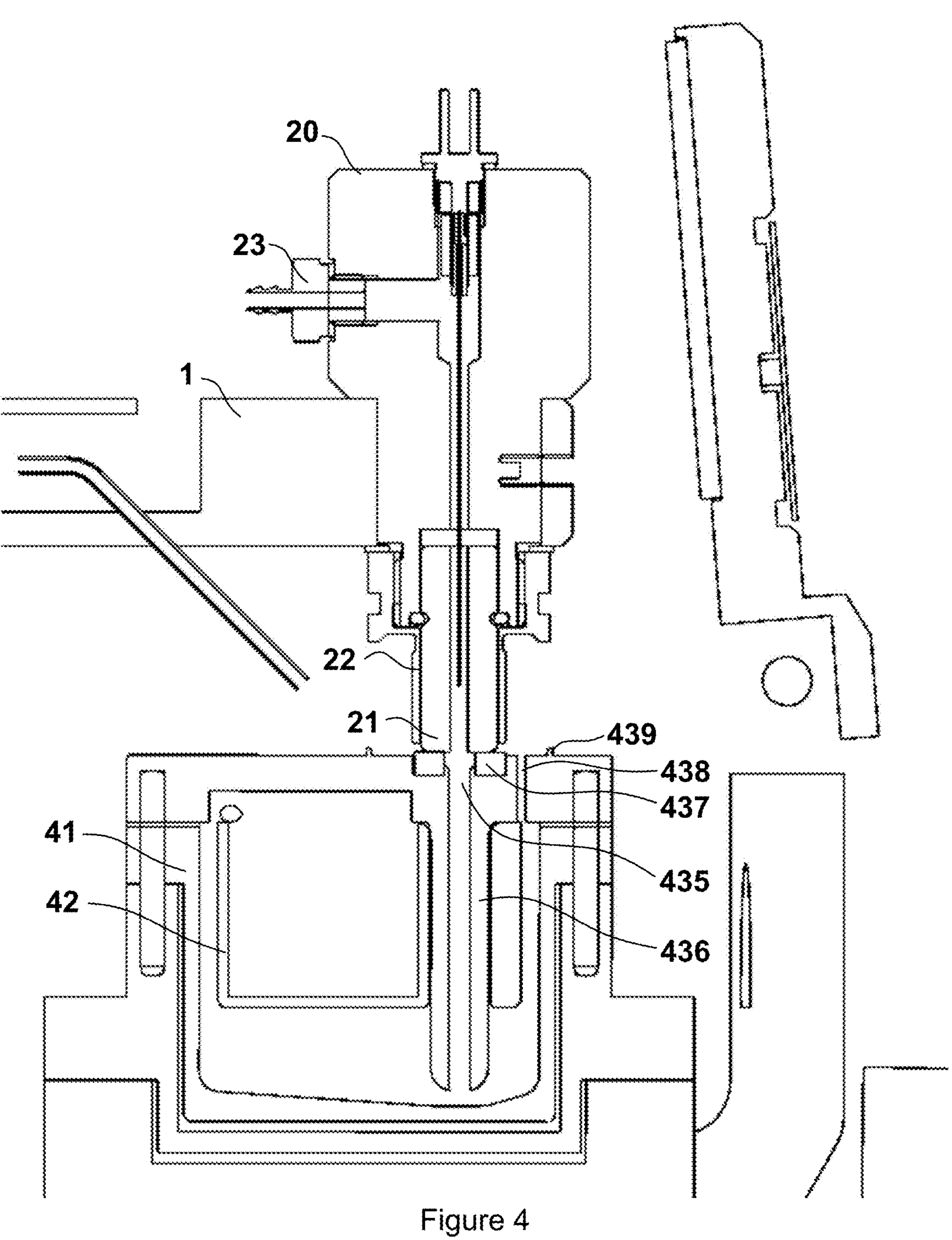
FIG. 4 is a sectional side view of the probe arm with the probe head in a second mercury change position.

FIG. 4 shows an example during the second stage of a variant of the mercury change operation, namely during drawing up a new mercury column from the clean mercury container 41. In the figure, the capillary tube 21 is arranged above a second through-hole, i.e. a draw hole 435 of the cover plate 43. The cover plate includes a draw tube 436 reaching down to the bottom of the clean mercury container and thus clean mercury can be drawn through the draw tube and through the draw hole 435 even when the level of mercury is low. A sealing element 437 is arranged around the top end of the draw hole 435 so as to facilitate fluidic sealing between the capillary tube 21 and the draw hole 435 so that the partial vacuum provided in the capillary tube 21 does not draw in air from the sides. Said sealing element 437 can be formed of an elastic material. The cover plate 43 can further include a second pressure relief hole 438 for allowing ambient fluid, e.g. air to enter the clean mercury reservoir when mercury is being drawn up therefrom. This facilitates drawing up mercury by providing a constant pressure equal to the ambient pressure, i.e. an overpressure relative to the partial vacuum within the capillary tube 21. This overpressure may be provided by other means, such as by a pressurized gas cartridge fluidically connected to the clean mercury reservoir, or by a spring-loaded or weighted cover that exerts pressure on the mercury. These measures may be employed together: the second pressure relief hole 438 provides pressure equal to ambient pressure, while the weight of the contaminated mercury container 42 and the contaminated mercury within exert pressure on the clean mercury. Furthermore, the contaminated mercury container may be spring-loaded to exert a larger pressure on the clean mercury underneath. The second pressure relief hole 438 is preferably smaller than the draw hole 435 to limit the escape of mercury vapor from the mercury containment unit.

The cover plate optionally further includes a second rim 439 projecting upward from a top surface of the cover plate 43 and surrounding top ends of both the draw hole 431 and of the second pressure relief hole 438 in order to prevent any mercury droplets that escaped from rolling away on the surface of the cover plate 43.

Figure 5:
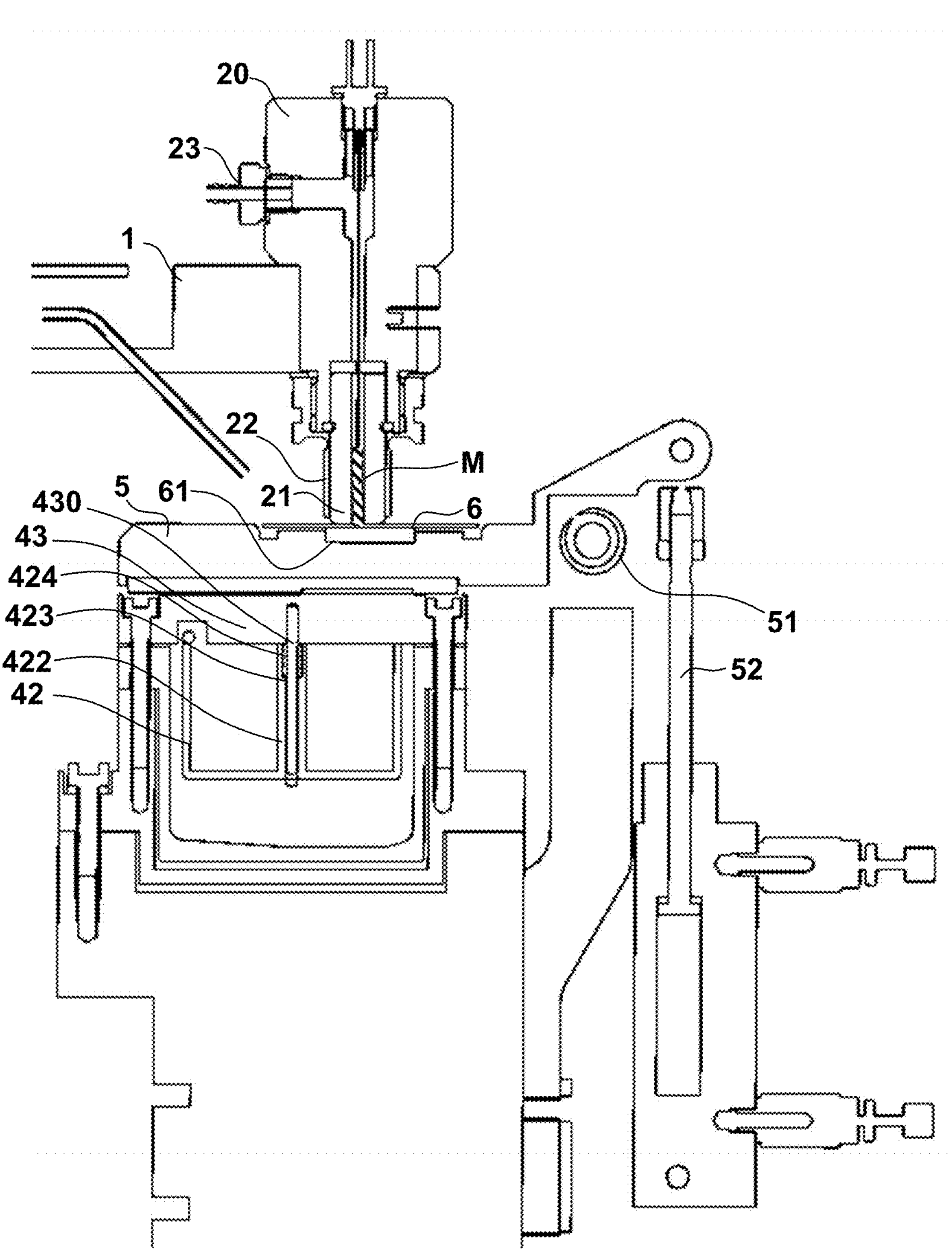
FIG. 5 is a sectional side view of the probe arm with the probe head in a parking position.

FIG. 5 shows a yet further preferred embodiment, wherein the apparatus includes a parking station 6 having a flat top surface and formed of material that is resistant to mercury, i.e., which does not enter into a chemical reaction with mercury, does not form amalgam or alloy with mercury, and cannot be penetrated by mercury, i.e. it is not porous. Such a material is for example silicon-dioxide and thus the parking station 6 may be formed by a piece of thermally oxidized Si wafer. Figure shows the probe head in a parking position, wherein the capillary tube 21 abuts on the top surface of the parking station in a fluidically sealing manner and the mercury column M is set down on the surface of the parking station, i.e. the partial vacuum holding it is released. This is a stand-by position of the apparatus, wherein the mercury column M is sealed from ambient air and thus its oxidation is prevented prolonging its lifetime. At the same time, evaporation of mercury is also prevented in the stand-by position, thus improving safety.

The parking station 6 can include a self-aligning mechanism 61 supporting the flat surface of the parking station 6. The self-aligning mechanism 61 facilitates establishing the sealing contact between the parking station 6 and the capillary tube 21 by slight adjustment of the tilt of the parking station 6 when contacted by the capillary tube 21. For example, the self-aligning mechanism 61 may be formed by a block of elastic material, which is compressed by the pressure exerted by the capillary tube 21 and ensures the abutment of the top surface of the parking station onto the bottom surface of the capillary tube 21. FIG. 5 shows an example, wherein the parking station 6 is located on the top of the lid 5. This is merely a convenient placement, because the positioning means is already capable of reaching the top of the mercury containers and the parking station 6 does not occupy another space in the apparatus. Alternatively, the parking station may be arranged any other location within the apparatus that is it is accessible by the probe head.

As shown in FIG. 5, the lid 5 is provided with a spring 51 that biases the lid 5 toward its closed position, so that in an unpowered state, and even when the mercury containment unit is removed from the apparatus, the lid 5 stays firmly closed to prevent evaporation and accidental spilling of mercury contained within. The lid 5 is can also be provided with an actuator 52 for opening and closing the lid 5 during operation. The actuator 52 may operate for example on hydraulic, electro-mechanic or pneumatic principle.

A central portion of the contaminated mercury container 42 is provided with a vertical guiding sleeve 422. A guiding rod 430 of the cover plate 43 may enter the guiding sleeve 422 to restrict the movement of the contaminated mercury container 42 so that it can move only vertically. Furthermore, a compression spring 424 may be arranged within the guiding sleeve 422 and around the guiding rod 430 so as to push the contaminated mercury container 42 down when the mercury containment unit is assembled. The guiding sleeve 422 may be provided with a suitable abutment surface, e.g. a flange or a shoulder 423 for the spring 424 to sit on.

Figure 6:
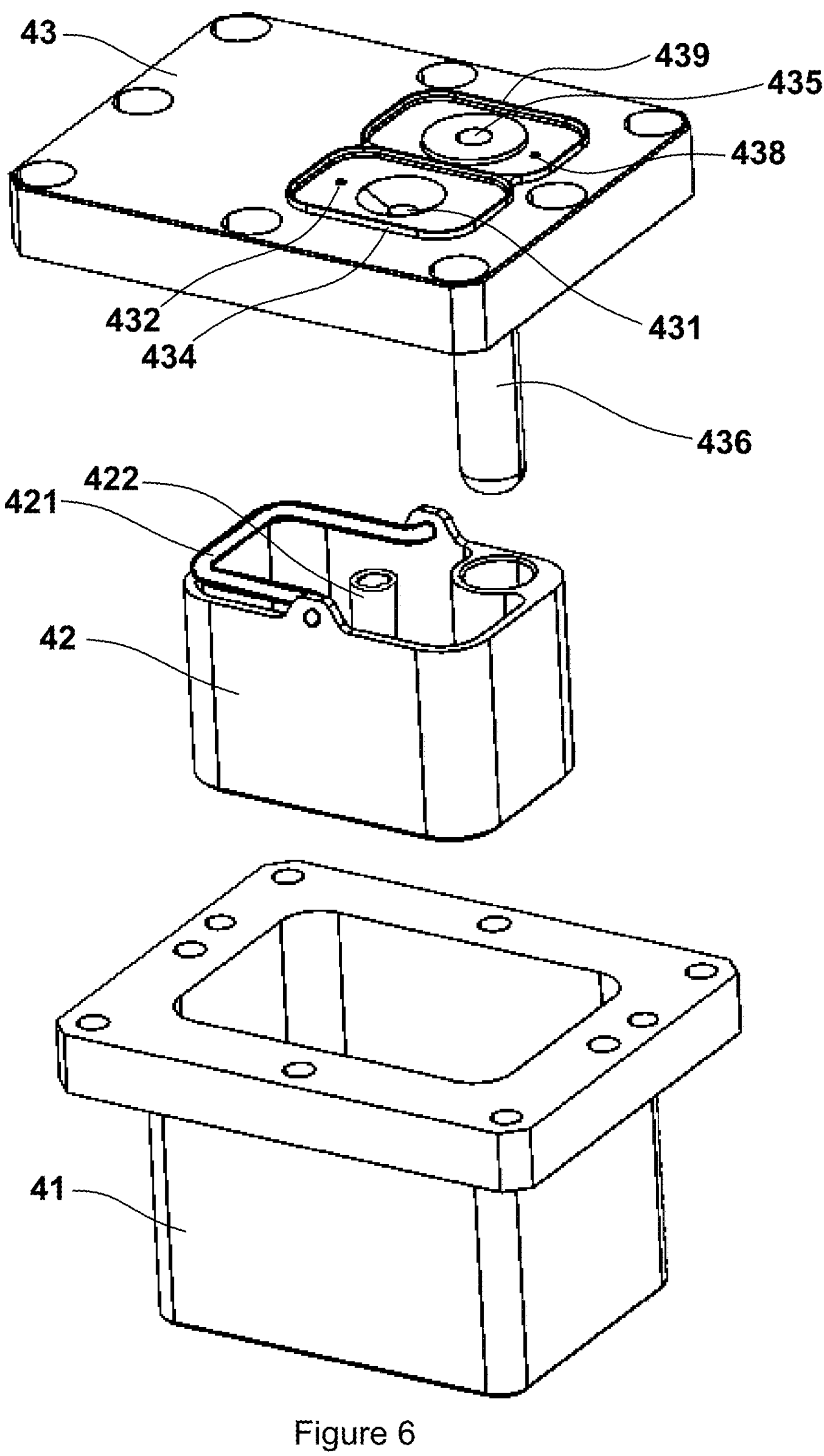
FIG. 6 is an exploded view of the main components of the first and second mercury containers.

FIG. 6 shows an exploded view of an example of a mercury containment unit of the apparatus, wherein the clean mercury container 41 is a receptacle that is open at its top side and closed from its sides and bottom, the contaminated mercury container 42 is formed as a bucket, having a closed bottom and closed side walls and an open top, furthermore the contaminated mercury container 42 and the clean mercury reservoir are sized so that the contaminated mercury container 42 fits into the clean mercury container 41. The contaminated mercury container 42 is provided with a handle 421 that may be raised and may be grabbed by either hand or tweezers and thus the contaminated mercury container 42 can be more easily removed from and placed into the clean mercury container 41.

The contaminated mercury container 42 is formed and sized so as to allow the draw tube 436 of the cover plate 43 to reach the bottom of the clean mercury container 41. This may be achieved for example by making a horizontal dimension of the contaminated mercury container 42 smaller than that of clean mercury container 41 by the amount needed to fit the draw tube 436 or by omitting a corner portion of the contaminated mercury container 42. Alternatively, this may be also achieved by providing a through-hole in the contaminated mercury container 42 that extends vertically through the contaminated mercury container 42, as shown in the Figure.

FIG. 6 also shows an arrangement of the first rim 434 and the second rim 439. In this example, the first rim 434 surrounds the dumping hole 431 and the first pressure relief hole 432, and the second rim 439 surrounds the draw hole 435 and the second pressure relief hole 438. The first rim 434 and the second rim 439 may have a common section or alternatively they may be formed as a single rim that surrounds all of the dumping hole 431, the draw hole 435, the first pressure relief hole 432 and the second pressure relief hole 438.

Figure 7:
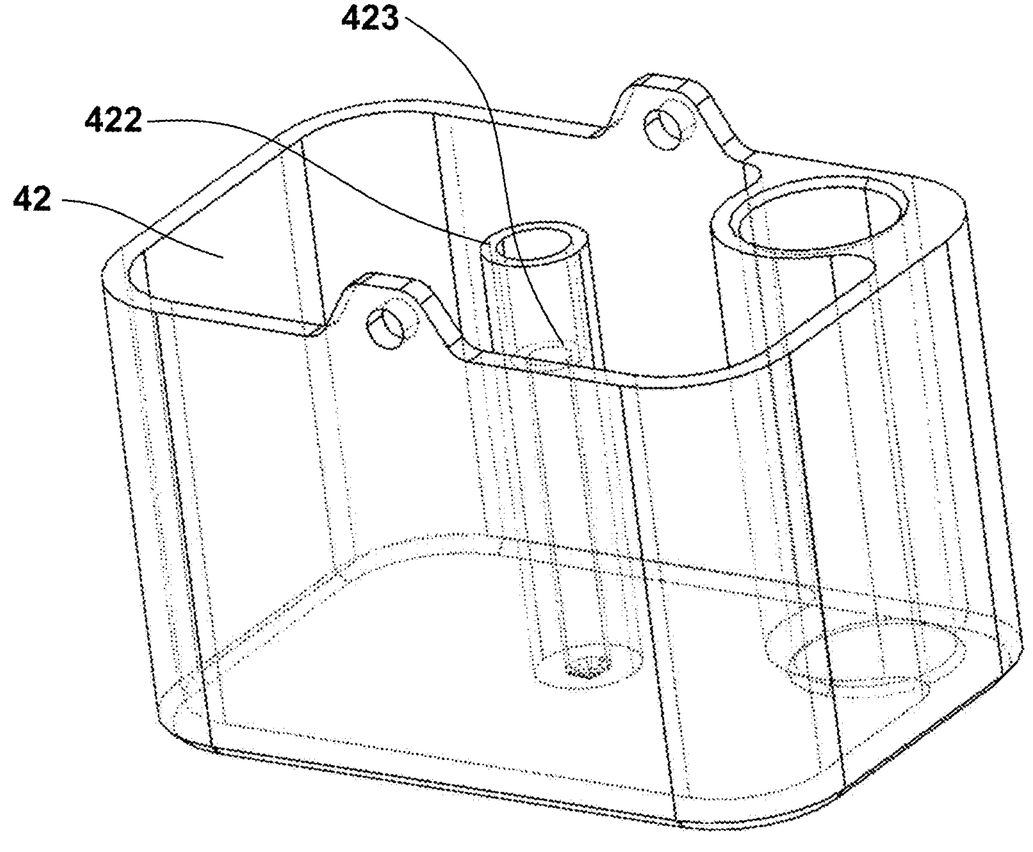
FIG. 7 is a detailed view of an exemplary embodiment of the contaminated mercury container.

FIG. 7 is a detailed view of an example of the contaminated mercury container 42 with the hidden lines displayed as dashed lines so that details of the guiding sleeve 422 with the shoulder 423 are more visible.

The measuring method includes the steps of bringing a capillary tube 21 that contains a mercury column M into contact with a top surface of the wafer W that is arranged on a wafer holder 3, lowering the mercury column M so as to form an electric contact between the mercury column M and the top surface of the wafer W, causing electric current to flow between the mercury column M and the wafer holder 3 through said wafer W, measuring the electric response of said wafer W. The method further includes the steps of checking whether a trigger condition is fulfilled and if the trigger condition is fulfilled, the mercury column M is replaced from a clean mercury container 41.

Said trigger condition may be one or more of a manual trigger by a user, a trigger from a manufacturing control system, a counter that counts the amount of measurements carried out reaching a predetermined threshold. Said threshold may be preset according to the cleanliness of the environment. For example, in an industrial cleanroom of the ISO 5 class according to standard ISO 14644-1, the threshold value may be set as high as 50000, i.e. up to fifty thousand measurements may be carried out with the same mercury column. However, in an R&D setting, where the environment is less clean, the threshold value may be less than 5000, i.e. only a few thousand measurements may be performed with the same mercury column. The amount and type of contamination on the wafers themselves is also a factor to be considered. For example, SiC wafers that usually have more particulate contamination on their surface tend to contaminate the mercury column in less measurement cycles.

Mercury that is available for replacing the mercury column held in the capillary tube is held in a sealed container, that may be opened and closed by an actuator. Accordingly, replacing the mercury column includes opening a lid 5 that hermetically seals said clean mercury container 41, dumping the mercury column M, drawing up a new mercury column M from the clean mercury container 41 and closing said lid 5.

Replacing the mercury column M may be performed by dumping it into a larger container containing a larger amount of mercury, and drawing up a new mercury column from the same container. This results in dilution of the contaminants within the larger mercury content and gradually lowers the repeatability of measurements, as each new mercury column will have a progressively increasing contamination from the beginning.

The replacement of the mercury column M in the method is performed by dumping the used mercury column into a contaminated mercury container 42 and then drawing a new mercury column from a clean mercury container 41 different from the used mercury container. This way, upon replacement of the mercury column M, the starting composition of the mercury column M is always the same and thus the repeatability of the measurements is ensured until the clean mercury container 41 runs out of mercury.

The method can further include returning the probe head into a stand-by position, wherein the capillary tube 21 is placed down onto a flat surface of a parking station 6 and the mercury column M is lowered down to contact said flat surface. This limits the exposure of mercury to oxygen and thus reduces its oxidation. Returning to said stand-by position is not necessary between each measurement of the same wafer, but it is advantageous when a measurement is not expected for a longer time period. For example, the stand-by mode may be engaged when the apparatus is turned off or put into a sleeping mode, or after finishing the measurement of a set of wafers or possibly when measurements of a single wafer are finished.

According to a further variant of the method, drawing up the mercury column M is performed while providing an AC voltage on the first terminal of the electrical measurement means that is connected to the first electrical contact 24 and measuring the capacitance of said first electrical contact 24. The first electrical contact has distinctly different capacitance values in a first state without contacting mercury and in a second state with contacting mercury. This difference is even larger in a preferred embodiment, wherein the clean mercury container 41 is made of an electrically insulating material and is placed in a metallic holder that is connected to ground potential, or more preferably to the second terminal of the electrical measurement means. This way, in the second state, wherein the first electrical contact 24 is in contact with a mercury column M that continuously fills the draw tube 436 and reaches a bottom of the clean mercury container 41, forms a condenser with said metallic holder with the clean mercury container 41 being the isolator therebetween. The drawing can be continued at least until a sharp increase in the measured capacitance is detected, that indicates that the mercury column M contacts the bottom of the first electrical contact 24. In some examples, the drawing is continued for a predetermined time after said increase is detected, in order to ensure that a mercury column of sufficient height will remain in the capillary 21 after lifting the capillary 21. When the capillary 21 is lifted, ambient medium may enter between the sealing element 437 and the capillary tube 21 thus the ambient pressure no longer supports the mercury within the draw tube 436 and thus the mercury column M is separated at a location in the proximity of the bottom of the capillary tube 21. The separation occurs at a random location within a range. Accordingly, said predetermined time can be selected so that an additional height by which mercury is drawn up during said time is about as large as said range and thus this additional height may ensure that the mercury column M remaining within the capillary tube 21 will be sufficient independently from the location of separation within said range.

The partial vacuum provided in the capillary tube 21 has a draw vacuum value for drawing up mercury from the clean mercury container and a hold vacuum value for holding the mercury column M. The hold vacuum for holding a mercury column M with a height of 5-15 mm is negative 5-15 Hgmm relative to ambient pressure. Drawing up mercury form the clean mercury container 41 requires a larger pressure difference that has to be able to lift and hold the column of mercury inside the draw tube 436 in addition to the mercury in the capillary tube 21, thus the draw vacuum is stronger than the hold vacuum, e.g. the draw vacuum may be about 50-70 Hgmm. Accordingly, when a sufficient mercury height is reached, i.e. when the drawing is deemed to be finished, the capillary tube 21 is lifted off the sealing element 437 and—e.g., at the same time—the partial vacuum provided in the capillary tube 21 is set to the hold vacuum value.

Generally, in framework of the present specification, the terms 'up', 'down', 'top', 'bottom', 'vertical', 'horizontal' and other similar expressions regarding orientations, directions and relative locations or movement of different components are to be understood as orientations, directions and relative locations as shown in the Figures, which also corresponds to the actual intended arrangement of the relevant parts in a properly installed apparatus.

What is claimed is:

1. An apparatus for measuring electrical properties of a semiconductor wafer, said apparatus comprising:

a wafer holder;

a mercury probe for contacting the top surface of said wafer with a mercury column, said mercury probe including a capillary tube for containing said mercury column;

a pneumatic control means for applying a partial vacuum or pressure above said mercury column within said capillary tube;

a probe arm having said mercury probe affixed thereto;

a positioning means for controlling the position of said capillary tube relative to the upper surface of said wafer;

a measurement means for causing an electrical current to flow through said wafer and for measuring electrical properties of said wafer;

a first electrical contact electrically connected to said mercury column and to said measurement means;

a second electrical contact electrically connected to said wafer holder and said measurement means;

a clean mercury container; and a control unit in operating connection with the pneumatic control means, the positioning means and the measurement means, wherein said mercury probe has at least one measurement position and a first mercury change position, the capillary tube is separated from the clean mercury container in said at least one measurement position, and the capillary tube is in fluid communication with the clean mercury container in said first mercury change position.

2. The apparatus of claim 1, wherein the clean mercury container comprises a lid for closing and hermetically sealing said clean mercury container.

3. The apparatus of claim 1, wherein the apparatus comprises a contaminated mercury container, and the probe head has a second mercury change position, wherein the probe head is in fluid communication with the contaminated mercury container is said second mercury change position.

4. The apparatus of claim 3, wherein the clean mercury container and the contaminated mercury container are arranged within a single enclosure, with their walls separating their mercury content.

5. The apparatus of claim 4, wherein the contaminated mercury container is formed as a bucket arranged within the clean mercury container so that a bottom of said contaminated mercury container rests on a top surface of mercury contained within the clean mercury container.

6. The apparatus of claim 5, wherein the contaminated mercury container is pushed down by a cover plate secured on top of the clean mercury container via a spring.

7. The apparatus of claim 1, wherein the apparatus comprises a parking station comprising a flat and smooth surface of a mercury-resistant material, and wherein the probe head has a parking position wherein the capillary tube is placed on the parking station with a bottom abutment surface of the capillary tube forming a sealing abutment with the top surface of the parking station.

8. The apparatus of claim 7, wherein the parking station is formed by a silicon wafer having a thermally oxidized top surface.

9. The apparatus of claim 7, wherein the parking station comprises a self-aligning mechanism for adjusting the alignment of the surface of the parking station to that of a bottom surface of the capillary tube that is placed on top of the parking station.

10. A method for measurement of electrical properties of a semiconductor wafer that is arranged on a wafer holder, said method comprising:

bringing a capillary tube that contains a mercury column into contact with a top surface of the wafer;

lowering the mercury column so as to form an electric contact between the mercury column and the top surface of the wafer;

applying a voltage between the mercury column and the wafer holder that is in electrical connection with said wafer;

performing electrical measurement to determine at least one electric parameter of said wafer;

checking whether a trigger condition is fulfilled, and if the trigger condition is fulfilled, the mercury column is replaced from a clean mercury container.

11. The method according to claim 10, wherein replacing the mercury column comprises opening a lid that hermetically seals said clean mercury container, dumping the mercury column, drawing up a new mercury column from the clean mercury container and closing said lid.

12. The method according to claim 10, wherein replacing the mercury column comprises dumping the mercury column into a contaminated mercury container and drawing a new mercury column from the clean mercury container that is separate from the contaminated mercury container.

13. The method according to claim 10, wherein the method further comprises placing down the capillary tube onto a flat surface of a parking station and lowering the mercury column down to contact said flat surface.

14. The method according to claim 10, wherein the trigger condition is any one of: a manual trigger by a user, a trigger from a manufacturing control system, a number of electrical measurements carried out since the last mercury change operation reaching a predetermined threshold.

15. The method according to claim 10, wherein electrical measurement is performed during the replacement of the mercury column to control a height of the mercury column drawn up to the capillary tube.

* * * * *